United States Patent
Lee et al.

(10) Patent No.: US 10,327,087 B2
(45) Date of Patent: Jun. 18, 2019

(54) AMPLIFIER MODULE AND CONTROL METHOD THEREOF

(71) Applicant: SAMSUNG ELECTRONICS CO., LTD., Suwon-si, Gyeonggi-do (KR)

(72) Inventors: Jae-cheol Lee, Yongin-si (KR); Hae-jong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/838,662

(22) Filed: Dec. 12, 2017

(65) Prior Publication Data

US 2018/0184223 A1    Jun. 28, 2018

(30) Foreign Application Priority Data

Dec. 23, 2016  (KR) .................. 10-2016-0177323

(51) Int. Cl.
| | | |
|---|---|---|
| H03F 1/08 | (2006.01) | |
| H04S 7/00 | (2006.01) | |
| H03F 3/217 | (2006.01) | |
| H03F 3/187 | (2006.01) | |
| H03F 3/21 | (2006.01) | |
| H03F 3/68 | (2006.01) | |
| H04R 3/00 | (2006.01) | |

(Continued)

(52) U.S. Cl.
CPC ................. *H04S 7/30* (2013.01); *H03F 1/08* (2013.01); *H03F 3/187* (2013.01); *H03F 3/211* (2013.01); *H03F 3/217* (2013.01); *H03F 3/68* (2013.01); *H04R 3/00* (2013.01); *H03F 2200/03* (2013.01); *H03F 2200/114* (2013.01); *H04R 3/12* (2013.01); *H04R 5/04* (2013.01); *H04R 2400/00* (2013.01)

(58) Field of Classification Search
CPC ....................................................... H03F 1/08
See application file for complete search history.

(56) References Cited

U.S. PATENT DOCUMENTS

| | | | | |
|---|---|---|---|---|
| 3,881,185 A | * | 4/1975 | Broline | ................. G05B 19/16 353/15 |
| 5,361,381 A | | 11/1994 | Short | |

(Continued)

FOREIGN PATENT DOCUMENTS

| | | |
|---|---|---|
| JP | 2001-168658 | 6/2001 |
| JP | 2007-116517 | 5/2007 |
| KR | 20-0282451 | 7/2002 |

OTHER PUBLICATIONS

Texas Instruments—User Guide, SLAU287A, Dec. 2009 (revised May 2010), 35 pages.

(Continued)

*Primary Examiner* — Patricia T Nguyen
(74) *Attorney, Agent, or Firm* — Nixon & Vanderhye P.C.

(57) ABSTRACT

There is provided an amplifier module which includes a plurality of input terminals; a plurality of amplifier circuits configured to amplify a plurality of input signals which are input from each of the plurality of input terminals and output a plurality of amplified signals; and at least one speaker which is directly connected to at least one output terminals from among the plurality of amplifier circuits, wherein the amplifier module may output the plurality of amplified signals to the at least one speaker based on a number of the at least one speaker.

19 Claims, 13 Drawing Sheets

BTL MODE

(51) Int. Cl.
H04R 5/04 (2006.01)
H04R 3/12 (2006.01)

(56) References Cited

U.S. PATENT DOCUMENTS

| | | |
|---|---|---|
| 8,135,158 B2 | 3/2012 | Fincham |
| 8,965,009 B2 | 2/2015 | Kim et al. |
| 2002/0131611 A1* | 9/2002 | Hoover .................... H04R 5/04 |
| | | 381/123 |
| 2004/0209584 A1* | 10/2004 | Bargroff .................. H03D 7/00 |
| | | 455/180.1 |
| 2006/0109991 A1 | 5/2006 | Kaneko |
| 2008/0036533 A1* | 2/2008 | Lim ...................... H03F 1/0288 |
| | | 330/124 R |
| 2011/0033060 A1 | 2/2011 | Johnson et al. |
| 2011/0096944 A1 | 4/2011 | Chee |
| 2011/0299433 A1* | 12/2011 | Darabi .................. H04B 1/525 |
| | | 370/277 |
| 2013/0034251 A1 | 2/2013 | Fincham |
| 2013/0316669 A1* | 11/2013 | Davierwalla ............ H03G 3/20 |
| | | 455/208 |
| 2014/0009230 A1 | 1/2014 | Nussbaum et al. |
| 2014/0192989 A1 | 7/2014 | Quilter et al. |
| 2015/0382109 A1 | 12/2015 | Kuromoto |

OTHER PUBLICATIONS

Search Report and Written Opinion dated Mar. 19, 2018 in counterpart International Patent Application No. PCT/KR2017/014545.

* cited by examiner

BTL MODE

BTL MODE

AMPLIFIER MODULE AND CONTROL METHOD THEREOF

CROSS-REFERENCE TO RELATED APPLICATIONS

This application is based on and claims priority from Korean Patent Application No. 10-2016-0177323, filed on Dec. 23, 2016 in the Korean Intellectual Property Office, the disclosure of which is incorporated herein by reference in its entirety.

BACKGROUND

1. Field

Apparatuses and methods consistent with exemplary embodiments of the present disclosure relate to an amplifier module and/or a controlling method thereof and, more particularly, to an amplifier module which amplifies an input signal and outputs the amplified signal and/or a controlling method thereof.

2. Description of the Related Art

A speaker system includes a cable connecting the amplifier to the speaker. As shown in FIG. 1, the amplifier circuit on the left side is connected to one side of the cable through a connector, and the other side of the cable can be connected to a speaker on the right side. As the cable is used, the damping factor characteristic is degraded. The formula for measuring the damping factor is as follows.

damping factor=$Z_{load}/Z_{source}=V_{load}/(V_{unload}-V_{load})$

Here, $Z_{load}=Z_{speaker\ unit}$ $Z_{source}=Z_{amp\ output}+Z_{speaker\ cable}$ As the impedance of the cable increases, the Zsource increases, the damping factor decreases, and the speaker driving capability may be degraded. That is, the larger the damping factor, the better the speaker driving capability can be, and the cable can be a factor to reduce the damping factor.

In particular, the passive type where the amplifier is located outside the speaker has a longer cable length than the active type in which the amplifier is located inside the speaker. That is, the passive type may have a lower speaker driving ability than the active type. On the other hand, active type amplifiers with cables inside the speaker, can result in complicated configuration and reduced space efficiency.

Meanwhile, the amplifier receives a plurality of input signals and outputs a plurality of amplified signals. In addition, the amplifier may receive a plurality of input signals and output one amplified signal depending on the situation.

Accordingly, there has been a demand for the development of amplifier(s) that provide improvements in the damping factor and/or a plurality of operation modes.

SUMMARY

Exemplary embodiments address at least one or more of the above problem(s) and/or disadvantages, and other disadvantages which may not be described above. Also, the exemplary embodiments are not required to overcome the disadvantages described above, and may not overcome any of the problems described above.

The present disclosure includes one or more exemplary embodiments that may address and/or solve the above-mentioned problem(s)/needs, and it is an example object of the one or more exemplary embodiments of the present disclosure to provide an amplifier module which changes a connection state of a plurality of output terminals of the amplifier circuit and/or operates in various modes, and/or a controlling method thereof.

According to an aspect of an exemplary embodiment, there is provided an amplifier module which includes a plurality of input terminals; a plurality of amplifier circuits configured to amplify a plurality of input signals which are input from each of the plurality of input terminals and output a plurality of amplified signals and at least one speaker which is directly connected to at least one output terminals from among the plurality of amplifier circuits, wherein the amplifier module may output the plurality of amplified signals to the at least one speaker based on a number of the at least one speaker.

In case of a first operation mode in which a speaker is directly connected to one output terminal from among the plurality of amplifier circuits and no speaker is directly connected to remaining output terminals from among the plurality of amplifier circuits, the amplifier module may combine the plurality of amplified signals and provides the combined signal to the directly-connected speaker, and in case of a second operation mode in which a plurality of speakers are directly connected to each output terminal of the plurality of amplifier circuits, provide each of the plurality of amplified signals to the plurality of speakers.

Wherein the amplifier module may further include a switch configured to be connected to an output terminal of the plurality of amplifier circuits, wherein the amplifier may, in the first operation mode, turn on the switch to short-circuit the output terminals of the plurality of amplifier circuits by the switch and combine the plurality of amplified signals, and in the second operation mode, turn off the switch to open the output terminals of the plurality of amplifier circuits and provide each of the plurality of amplified signals to the plurality of speakers module.

The plurality of amplifier circuits BTL (bridge-tied load) are amplifier circuits in a bridge-tied load (BTL) type, wherein the amplifier module connects in parallel the output terminals of the plurality of amplifier circuits by the switch in the first operation mode, and amplifies current of the plurality of amplified signals.

The plurality of amplifier circuits are amplifier circuits of a single ended (SE) type, wherein the amplifier module may serially connect the output terminals of the plurality of amplifier circuits by the switch in the first operation mode and amplify voltage of the plurality of amplified signals.

The plurality of input terminals include a power input terminal, a grounding terminal, a first input signal terminal, and a second input signal terminal, and wherein the plurality of amplifier circuits include a first amplifier circuit configured to receive a first input signal which is input from the first input signal terminal; and a second amplifier circuit configured to receive a second input signal which is input from the second input signal terminal.

The amplifier module, when the first input signal and the second input signal are the same or have opposite phases, may combine the plurality of amplified signals and provide to the directly-connected speaker.

The plurality of amplifier circuits further includes a plurality of output terminals which are connected to each of the output terminals of the plurality of amplifier circuits, wherein the at least one speaker may be directly connected to at least one of the plurality of output terminals and connected to the plurality of amplifier circuits.

Each of the plurality of amplifier circuits may include at least one amp integrated circuit (IC) and a capacitor.

According to an exemplary embodiment, the A control method of an amplifier module which includes a plurality of input terminals, a plurality of amplifier circuits, and at least one speaker which is directly connected to at least one output terminals from among the plurality of amplifier circuits may include, by the plurality of amplifier circuits, amplifying a plurality of input signals which are input from each of the plurality of input terminals; and outputting a plurality of amplified signals in which the plurality of input signals are amplified by the plurality of amplifier circuits, wherein the outputting comprises outputting the plurality of amplified signals to the at least one speaker based on a number of the at least one speaker.

The outputting may include, in case of a first operation mode in which a speaker is directly connected to one output terminal from among the plurality of amplifier circuits and no speaker is directly connected to remaining output terminals from among the plurality of amplifier circuits, combining the plurality of amplified signals and providing the combined signal to the directly-connected speaker, and in case of a second operation mode in which a plurality of speakers are directly connected to each output terminal of the plurality of amplifier circuits, providing each of the plurality of amplified signals to the plurality of speakers.

The outputting may include, in the first operation mode, turning on the switch to short-circuit the output terminals of the plurality of amplifier circuits by the switch and combining the plurality of amplified signals, and in the second operation mode, turning off the switch to open the output terminals of the plurality of amplifier circuits and providing each of the plurality of amplified signals to the plurality of speakers.

The plurality of amplifier circuits are amplifier circuits in a bridge-tied load (BTL) type, wherein the outputting may include connecting in parallel the output terminals of the plurality of amplifier circuits by the switch in the first operation mode, and amplifying current of the plurality of amplified signals.

The plurality of amplifier circuits may be amplifier circuits of a single ended (SE) type, wherein the outputting may include serially connecting the output terminals of the plurality of amplifier circuits by the switch in the first operation mode and amplifying voltage of the plurality of amplified signals.

The plurality of input terminals may include a power input terminal, a grounding terminal, a first input signal terminal, and a second input signal terminal, wherein the plurality of amplifier circuits may include a first amplifier circuit and a second amplifier circuit, wherein the amplifying may include amplifying the first input signal input from the first input signal terminal by the first amplifier circuit, and amplifying the second input signal input from the second input signal terminal by the second amplifier circuit.

The outputting may include, when the first input signal and the second input signal are the same or have opposite phases, combining the plurality of amplified signals and providing to the directly-connected speaker.

The plurality of amplifier circuits may further include a plurality of output terminals which are connected to each of the output terminals of the plurality of amplifier circuits, wherein the at least one speaker may be directly connected to at least one of the plurality of output terminals and connected to the plurality of amplifier circuits.

Each of the plurality of amplifier circuits may include at least one amp integrated circuit (IC) and a capacitor.

A recordable medium having a program to execute an operation method of an amplifier module which includes a plurality of input terminals, a plurality of amplifier circuits, and at least one speaker which is directly connected to at least one output terminals from among the plurality of amplifier circuits, wherein the operation method includes amplifying a plurality of input signals input from each of the plurality of input terminals by the plurality of amplifier circuits; and outputting a plurality of amplified signals in which the plurality of input signals are amplified by the plurality of amplifier circuits, wherein the outputting may include outputting the plurality of amplified signals to the at least one speaker based on the number at least one speaker.

According to various embodiments of the present invention as described above, the amplifier module operates in various modes according to the number of directly connected speakers, and the output terminal of the amplifier module and the input terminal of the speaker are directly connected to provide improved audio performance.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
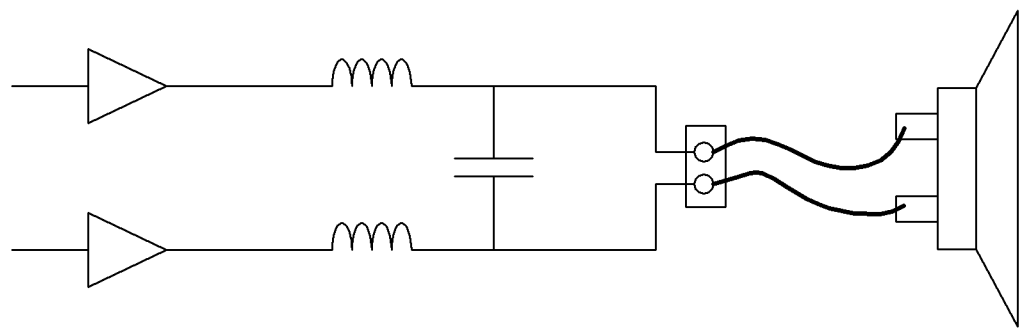
FIG. 1 is a speaker system according to a related art.

Exemplary embodiments of the present disclosure may be diversely modified. Accordingly, specific exemplary embodiments are illustrated in the drawings, in which like reference numerals indicate like parts throughout the several views, and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail.

Exemplary embodiments are described in greater detail below with reference to the accompanying drawings.

Figure 2:
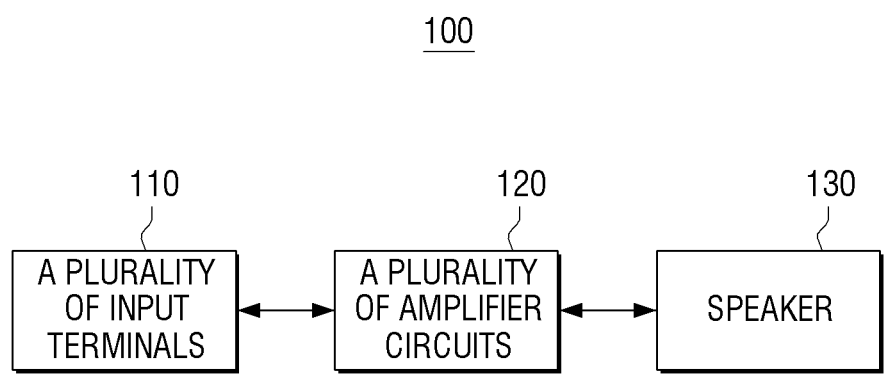
FIG. 2 is a view to describe an amplifier module according to an exemplary embodiment.

FIG. 2 illustrates an amplifier module 100, including amplifying circuitry, according to an exemplary embodiment. According to FIG. 2, the amplifier module 100 includes a plurality of input terminals 110, a plurality of amplifier circuits 120, and at least one speaker 130. Here, the speaker 130 may be one or more.

The amplifier module 100 may be an apparatus which amplifies and outputs an input signal. For example, the amplifier module 100, after receiving and amplifying an audio signal, may output the amplified audio signal through the speaker.

The amplifier module 100 may operate in a plurality of operation modes. For example, the amplifier module 100 may receive a plurality of input signals and output a plurality of amplified signals corresponding to each input signal. Alternatively, the amplifier module 100 may receive a plurality of input signals and output one amplified signal. Or, the amplifier module 100 may receive one input signal and output one amplified signal.

A plurality of input terminals 110 may include at least a power source input terminal, a grounding terminal, a first input signal terminal, and a second input signal terminal. The power source input terminal and the grounding terminal may be to supply power to the amplifier module 100.

The first input signal terminal and the second input signal terminal may be to receive a plurality of input signals. For example, the first input signal terminal and the second input signal terminal may receive the same input signal. Alternatively, the first input signal terminal and the second input signal terminal may receive different input signals. Alternatively, the first input signal terminal and the second input signal terminal may receive respective input signals of which phases are opposite from each other.

Alternatively, only one of the first input signal terminal and the second input signal terminal may receive one input signal. Or, each of the first input signal terminal and the second input signal terminal may receive stereo input signals of L channel and R channel. Each of the first input signal terminal and the second input signal terminal may receive different input signals.

Example embodiments are not limited thereto, and the plurality of input terminals 110 may include other types of input terminals. For example, the plurality of input terminals 110 may include a terminal to receive reset input. Or, the plurality of input terminals 110 may include more than two input signal terminals.

The plurality of amplifier circuits 120 amplify the plurality of input signals input from each of the plurality of input terminals 110, and output a plurality of amplified signals. For example, the plurality amplifier circuit 120 may include a first amplifier circuit for receiving a first input signal input from a first input signal terminal and a second amplifier circuit for receiving a second input signal input from a second input signal terminal. However, the present invention is not limited thereto, and the number of amplifier circuits constituting the plural amplifier circuit 120 can be changed.

Each of a plurality of amplifier circuits 120 may include at least one amplifier IC and capacitance. In addition, each of the plurality of amplifier circuits 120 may include at least one inductor.

The present invention is not limited thereto and an amplifier circuit may be implemented as various types. Any amplification circuit which amplifies and outputs an input signal may be utilized in certain example instances.

The speaker 130 may be directly connected to at least one of output terminals of the plurality amplifier circuit 120. Here, 'directly connect' means that the plurality amplifier circuits 120 and the speaker 130 are directly connected without a separate line therebetween.

When there is one speaker 130, the speaker 130 may be directly connected to one of the output terminals of the plurality amplifier circuit 120. Where there are a plurality of the speakers 130, each speaker 130 may be directly connected to each of the output terminals of the plurality amplifier circuit 120. That is, the amplifier module 100 may include at least one speaker 130.

The speaker 130 may receive an amplified signal from the directly-connected amplifier circuit and output the input amplified signal as sound.

The amplifier module 100, based on the number of the at least one speakers 130, may output e plurality of amplified signal to at least one speaker 130.

For example, the amplifier module 100, in case of the first operation mode in which the speaker is directly connected to one output terminal from among the plurality of amplifier circuits 120, no speaker is directly connected to remaining output terminals of the plurality of amplifier circuits 120, may combine a plurality of amplified signals and provide to the directly-connected speaker, and in case of a second operation mode in which a plurality of speakers are directly connected to output terminals of the plurality of amplifier circuits 120, provide each of the plurality of amplified signals to the plurality of speakers.

The amplifier module 100 may further include a switch connected to an output terminal of the plurality of amplifier circuits 120. The amplifier module 100 turns on the switch in the first operation mode and couples the plurality of amplified signals by shortening between the output terminals of the plurality of amplifier circuits by the switch, and in the second operation mode, the amplifier module 100 turns off the switch to open the output terminals of the plurality of amplifier circuits 120 and provide each of the plurality of amplified signals to the plurality of speakers.

The amplifier module 100 may further include a plurality of output terminals (not shown) connected to each of the output terminals of the plurality of amplifier circuits 120. The speaker 130 may be directly connected to at least one of the plurality of output terminals and connected to the plurality of amplifier circuits 120. Accordingly, the impedance between the plurality of output terminals and the input terminals of the speaker 130 may be minimized/reduced by transmitting the amplified signal without a separate cable connecting the plurality of output terminals and the input terminal of the at least one speaker 130, and damping factor may be improved.

In addition, improvement of the characteristic of Electro Magnetic Interference (EMI) can be improved, which will be described later. The EMI indicates a state in which other electronic devices are obstructed by noise generated from an electronic device.

As described above, the amplifier module 100 may include a plurality of input terminals 110, the plurality amplifier circuits 120, the speaker 130, and an output terminal and the amplifier module can be manufactured in a package.

Hereinbelow, an operation of the amplifier module 100 will be described in a greater detail.

Figure 3A:
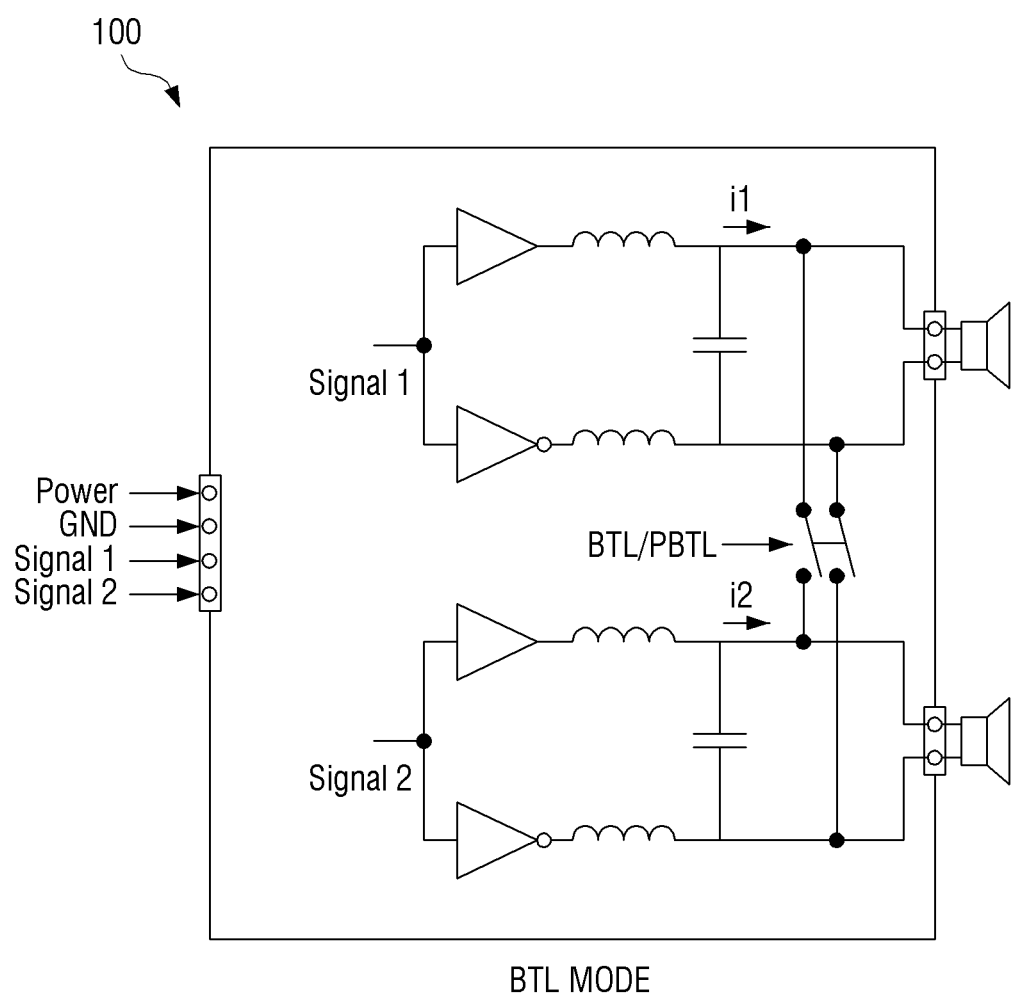
FIGS. 3A and 3B are views to describe an operation of an amplifier module which includes an amplifier circuit in a bridge-tied load (BM) type according to an exemplary embodiment.
Figure 3B:
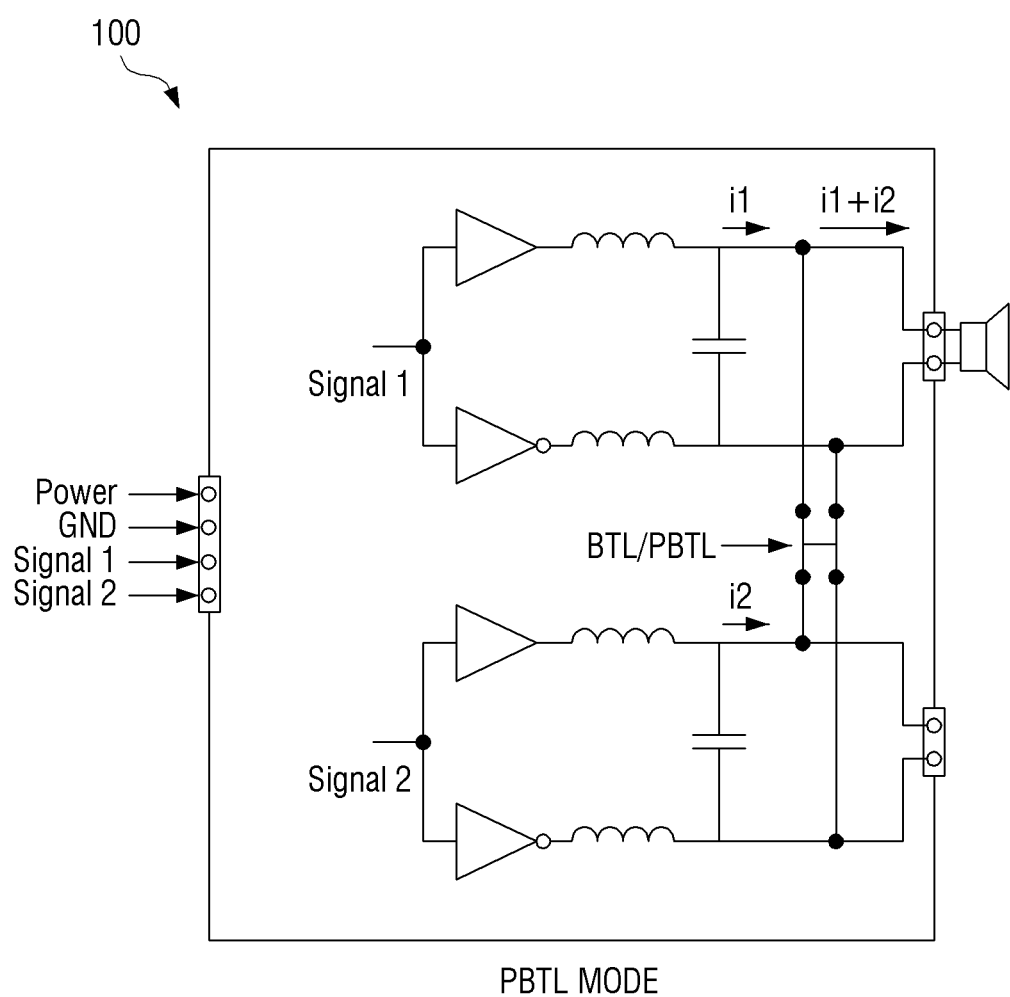

FIGS. 3A and 3B are views to illustrate an operation of the amplifier module 100 which includes an amplifier circuit in a bridge-tied load (BTL) type according to an exemplary embodiment.

As illustrated in FIG. 3A, the plurality of amplifier circuits 120 are bridge-tied load (BTL) type amplifier circuits, and the amplifier module 100 turns off the switch in the second operation mode to open the output terminals and provide a plurality of amplified signals to the plurality of speakers. Here, the second operation mode may be a state in which a plurality of speakers are directly connected to the output terminals of the plurality of amplifier circuits.

For example, the first amplifier circuit may receive the first input signal which is input from the first input terminal, from among a plurality of amplifier circuits, and amplify the received first input signal to output i1. From among a plurality of amplifier circuits, the second amplifier circuit may receive the second input signal which is input from the second input terminal, amplify the received second input signal, and output i2.

When the switch is turned off, the space between the output terminals of the plurality amplifier circuits 120 is opened, and the first amplifier circuit and the second amplifier circuit may output i1 and i2 without any significant interference between each other.

Alternatively, as shown in FIG. 3B, the amplifier module 100 may turn on the switch in the first operation mode and shortcut the space between the output terminals of the plurality of amplifier circuits 120 by a switch to couple the amplified signals. That is, in the first operation mode, the amplifier module 100 can couple the output terminals of the plurality of amplifier circuits by the switch in parallel and amplify the currents of the plurality of amplified signals. Here, the first operation mode may be a state in which the speaker is directly connected to the output terminal of one of the plurality of amplifier circuits, and there are no speakers directly connected to the remaining output terminals of the amplifier circuits.

For example, the first amplifier circuit from among a plurality of amplifier circuits may receive the first input signal which is input from the first input terminal, amplify the received first input signal to output i1. The second amplifier circuit from among a plurality of second amplifier circuits may receive the second input signal input from the second input terminal, amplify the received second input signal and output i2.

However, when the switch is turned on, the first amplifier circuit and the second amplifier circuit may affect each other. In FIG. 3B, the output terminal connected to the second amplifier circuit is opened and i2 can be outputted to the first amplifier circuit through the switch. I1 output from the first amplifier circuit is combined with i2 output from the second amplifier circuit, and the current of i1+i2 can be output to an output terminal connected to the first amplifier circuit. Therefore, if the first input signal input to the first amplifier circuit and the second input signal input to the second amplifier circuit are the same signal, the amplification efficiency can be improved.

Alternatively, the amplifier module 100, when the first input signal and the second input signal are the same in the first operation mode, may couple the plurality of amplified signals and provide the same to the connected speaker.

As described above, the amplifier module 100 may operate in the BTL mode of FIG. 3A and/or the parallel bridge-tied load (PBTL) mode of FIG. 3B.

Figure 4A:
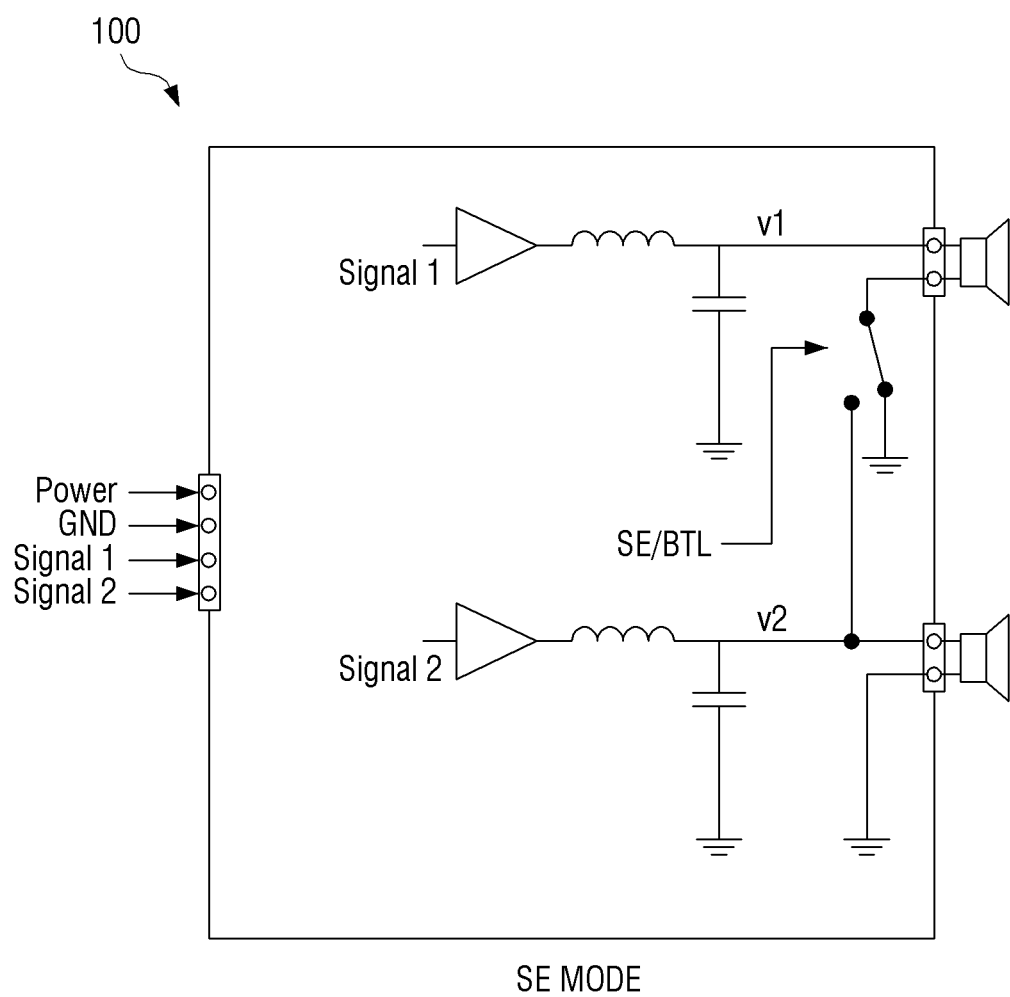
FIGS. 4A and 4B are views to describe an operation of an amplifier module which includes an am circuit in a single ended (SE) type according to an exemplary embodiment.
Figure 4B:
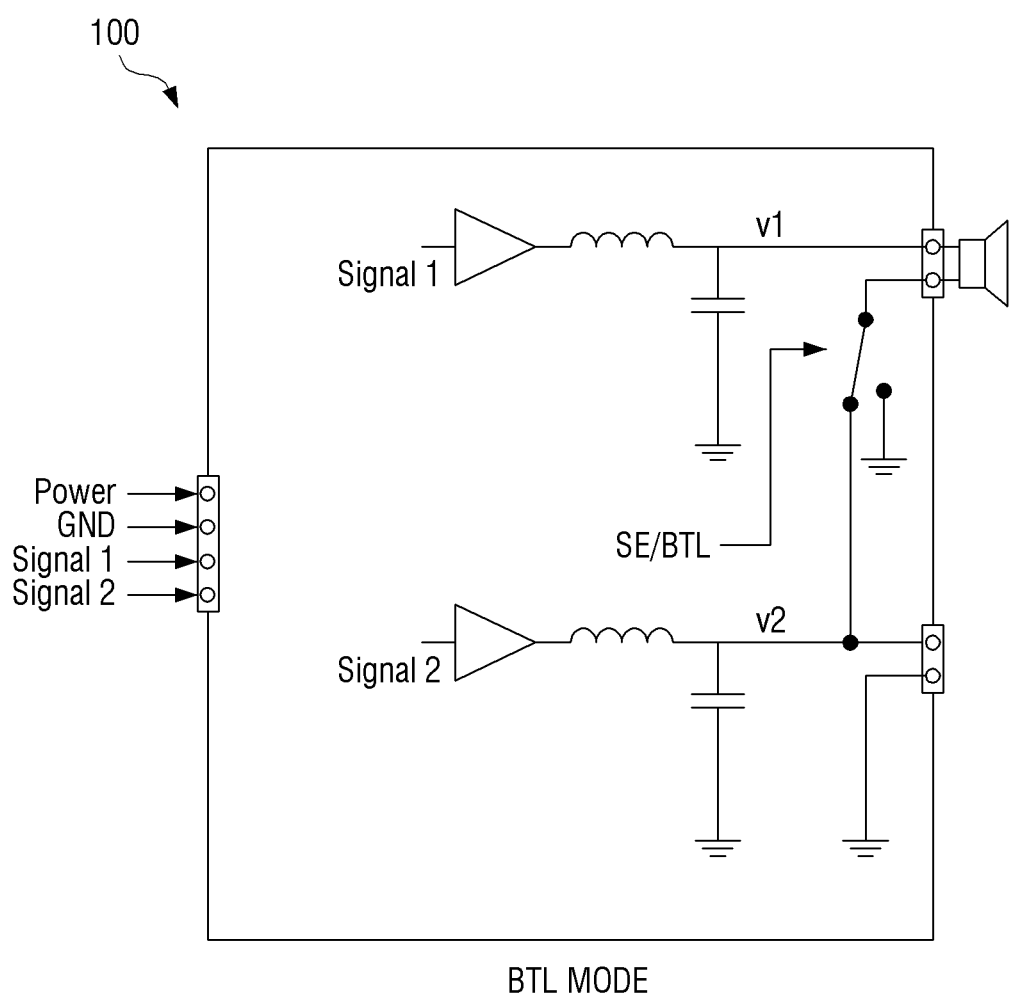

FIGS. 4A and 4B are views to illustrate an operation of an amplifier module which includes an am circuit in a single ended (SE) type according to an exemplary embodiment.

As illustrated in FIG. 4A, the plurality amplifier circuits 120 may be an amplifier circuit of single ended (SE) type, and the amplifier module 100 may turn off the switch in the second operation mode to open the space between the plurality of amplifier circuits 120, and provide each of the plurality of amplified signals to each of the plurality of speakers. Here, the second operation mode may be a state in which the plurality of speakers are directly connected to each output terminal of a plurality of amplifier circuits.

For example, the first amplifier circuit among the plurality of amplifier circuits may receive the first input signal input from the first input terminal, amplify the received first input signal, and output v1. The second amplifier circuit from among the plurality of amplifier circuits can receive the second input signal input from the second input terminal and amplify the received second input signal to output v2.

At this time, when the switch is turned off, the space between the output terminals of the plurality amplifier circuits 120 is opened, and the first amplifier circuit and the second amplifier circuit may output v1 and v2 without interference from each other.

As illustrated in FIG. 4B, the amplifier module 100 may turn on the switch in the first operation mode, shortcut the space between the output terminals of the plurality of amplifier circuits 120 by the switch and couple the plurality of amplified signals. In other words, the amplifier module 100 may serially connect the output terminal of the plurality of amplifier circuits by the switch and amplify the voltage of the plurality of amplified signal. Here, the first operation mode may be a state that a speaker is connected to one output terminal from among a plurality of amplifier circuits and no speaker is connected to remaining output terminal of the plurality of amplifier circuits.

For example, the first amplifier circuit from among a plurality of amplifier circuits may receive a first input signal which is input from the first input terminal, amplify the received first input signal, and output v1. From among the plurality of amplifier circuits, the second amplifier circuit may receive the second input signal which is input from the second input terminal, amplify the received second input signal, and output v2.

In the meantime, when the switch is turned on, the first amplifier circuit and the second amplifier circuit may affect each other. In FIG. 4B, v1 may be applied to one side of the output terminal which is connected to the first amplifier circuit, and v2 may be applied to another side of the output terminal which is connected to the first amplifier circuit. That is, to the output terminal connected to the first amplifier circuit, voltage which has size of v1-v2 may be applied. Therefore, if the first input signal which is input to the first amplifier circuit is a signal of which phase is opposite to the second input signal, amplification efficiency may be improved.

The amplifier module 100, when phase of the first input signal is opposite to the phase of the second input signal in the first operation mode, may couple the plurality of amplified signals and provide the same to the directly-connected speaker.

As described above, the amplifier module 100 may operate with the SE mode of FIG. 4A and/or the BTL mode of FIG. 4B.

In FIGS. 3A to 4B, the operation of the amplifier module 100 according to example operation modes has been described. Here, it is described that the operation mode is based on the number of the directly-connected speakers, but the present invention is not limited thereto.

For example, the amplifier module 100 may further include an input terminal to receive a user command for an operation mode and an operation mode can be determined according to a user command.

The operation mode may be determined based on an input signal. For example, the amplifier module 100 operate as the first operation mode, when the first input signal and the second input signal are the same or of which phase is opposite, and may operate in the second mode in other cases.

The operation mode may be determined based on the number of the input signals. For example, the amplifier module 100 may operate with the first operation mode when there are a plurality of input signals, and may operate with the second operation mode when there is one input signal.

In other words, the amplifier module 100 may determine an operation mode based on at least one of the number of input signals input from a plurality of input terminals 110, whether signals are the same, phase difference, and the number of connected speakers.

In this case, the amplifier module 100 may further include a switch controller to control a switch. The switch controller may be configured to detect one of the number of input signals input from the plurality of input terminals 100, whether signals are the same, phase difference, and the number of connected speakers, and control a position of the switch based on the detection result.

Figure 5A:
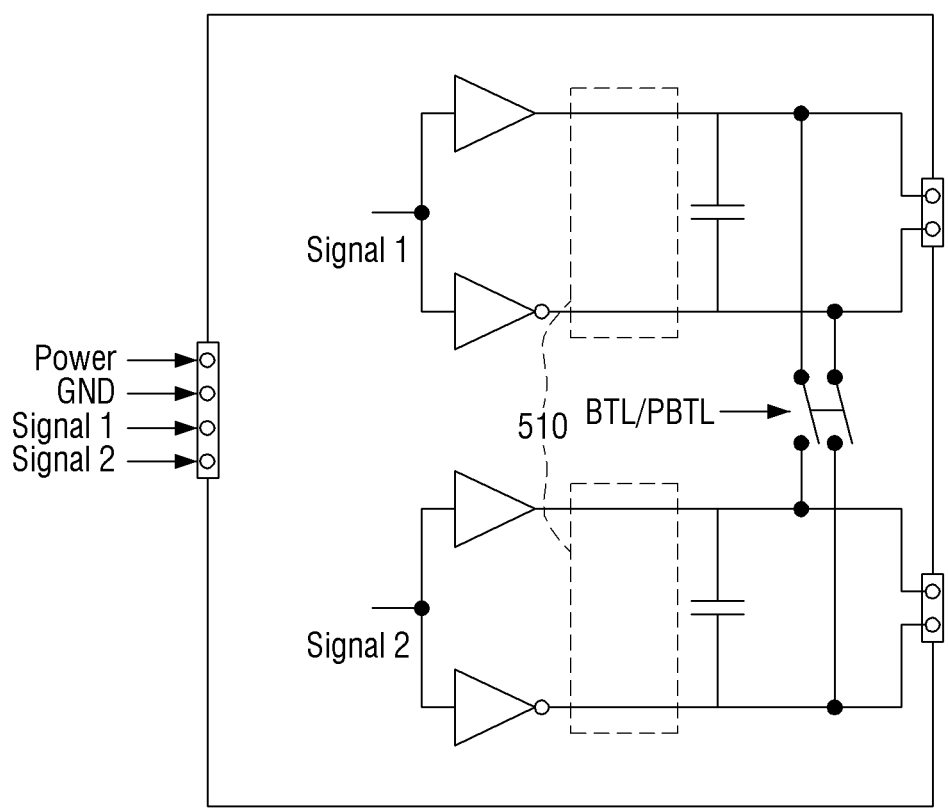
FIGS. 5A and 5B are views to describe an amplifier circuit from which an inductor is removed according to an exemplary embodiment.
Figure 5B:
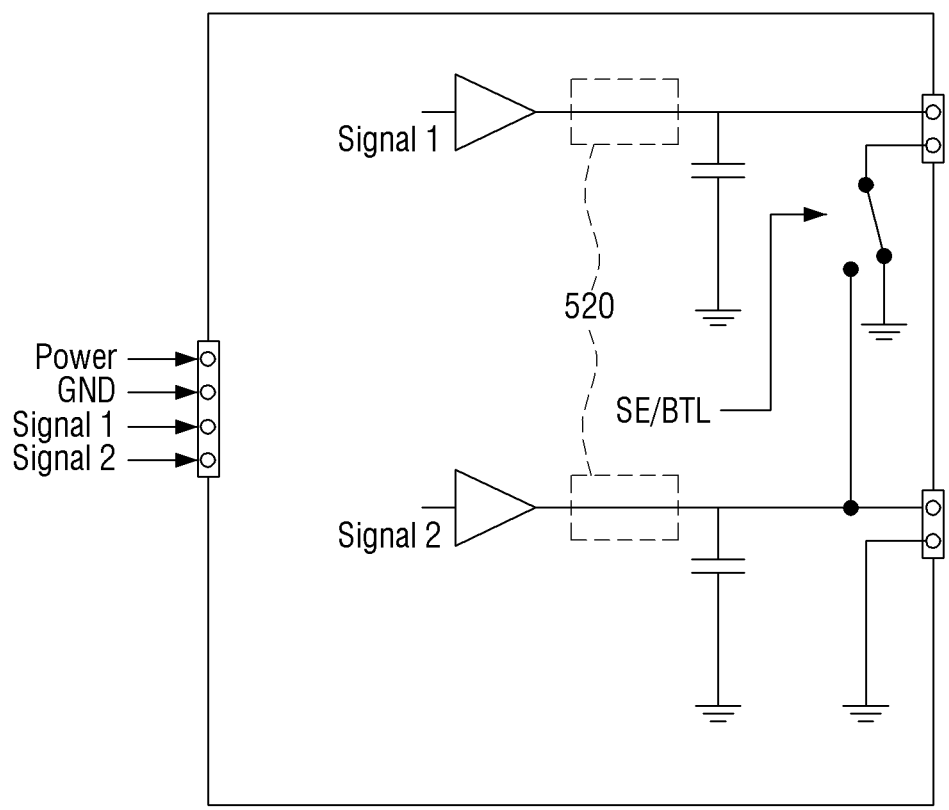

FIGS. 5A and 5B are views to describe an amplifier circuit from which an inductor is removed according to an exemplary embodiment.

In FIGS. 3A to 4B, the plurality amplifier circuits 120 include an inductor in the space 510, 520 between at least one amp IC and the capacitor.

As illustrated in FIGS. 5A and 5B, each of a plurality of amplifier circuits 120 may include at least one amp IC and the capacitor. That is, the plurality of amplifier circuits 120 need not include the inductor in the space 510, 520 between the at least one amp IC and the capacitor(s).

In general, when a speaker which outputs 10 MW or more may include the inductor in the space 510, 520 between the at least one amp IC and the capacitor in order to improve the characteristic of the EMI.

In the meantime, example embodiments of the present invention may improve the characteristic of EMI. Example embodiments may improve the characteristics of EMI without an inductor, even if a speaker which has an output of 10 MW or more is connected, as the amplifier module 100 is the speaker are directly connected to each other. Accordingly, a size of the amplifier module 100 can be reduced and manufacturing cost can be saved.

Figure 6A:
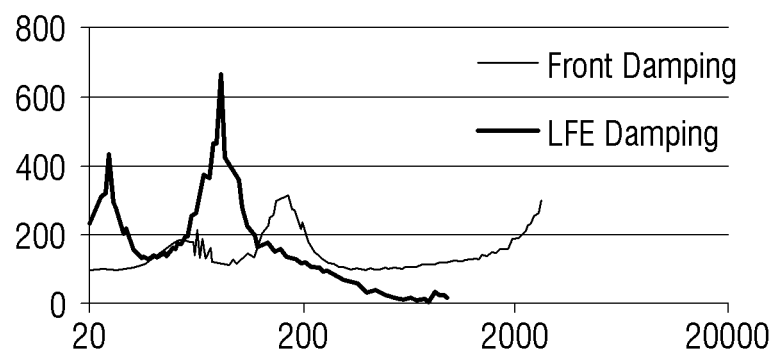
FIGS. 6A and 6B are views to describe a value of a damping factor according to an exemplary embodiment.
Figure 6B:
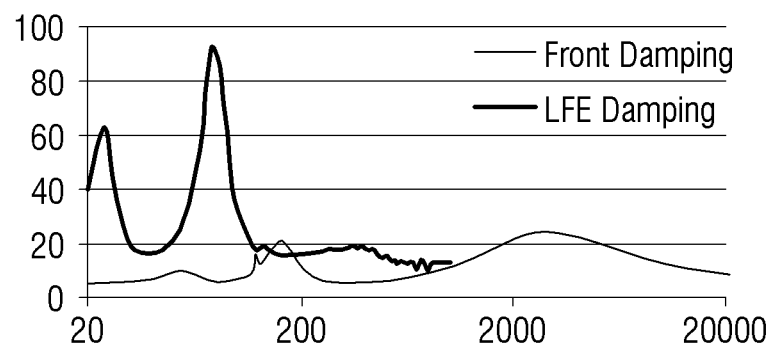

FIGS. 6A and 6B are graphs that illustrate a value of a damping factor according to an exemplary embodiment.

FIG. 6A indicates a damping factor value which is measured from a terminal to which a cable is connected after output of the amplifier module 100. FIG. 6B indicates a damping factor value which is measured in a part connected to the input terminal of the speaker.

As illustrated in FIG. 6B, while passing by the cable, the damping factor value is measured to decrease to about 1/10, and the driving performance of the speaker may be deteriorated.

Accordingly, when the output terminal of the amplifier module 100 and the input terminal of the speaker are directly connected, the damping factor value which is similar to FIG. 6A can be secured and the driving performance of the speaker may be improved.

In the meantime, when the output terminal of the amplifier module 100 and the input terminal of the speaker are connected using a cable, speaker output and a ground signal can be transmitted. In this case, affected by external noise, an output signal can be distorted. Therefore, a cable is not used and distortion of an output signal can be minimized.

In addition, the first input signal and the second input signal are configured + and − (differentially) so that the signals are strong against an external noise. Alternatively, by using a shield cable which is comparatively small, the signals can be designed to be strong against an external noise.

Figure 7:
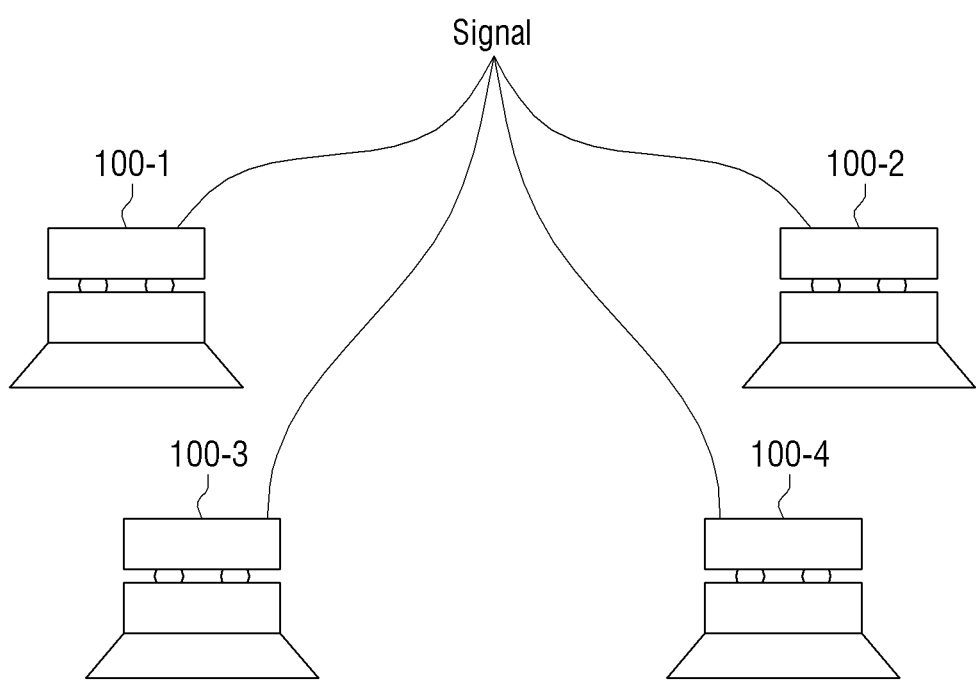
FIG. 7 is a view to describe a car audio system according to an exemplary embodiment.

FIG. 7 illustrates a car audio system according to an exemplary embodiment.

In the related art system, there is a case in which a main board and an outer speaker are installed in order to minimize a size. In the meantime, the example embodiments of the present invention may minimize or reduce a size by making an amplifier as a module.

Alternatively, the amplifier module 100 may be implemented as a type of a unified active unit including a speaker which is directly connected to an amplifier circuit.

That is, as illustrated in FIG. 7, a plurality amplifier modules 100-1, 100-2, 100-3, and 100-4 may include speakers directly connected to each amplifier circuit.

For example, the first amplifier module 100-1 and the second amplifier module 100-2 may be used as a front left speaker and a front right speaker, respectively, of an automobile. In addition, a third amplifier module 100-3 and a fourth amplifier module 100-4 may be used as a rear left speaker and a rear right speaker, respectively, of an automobile.

In case of a related-art, in a process in which a signal which is amplified through the related-art one amplifier module is transmitted by cables which are connected to each of a front left speaker, a front right speaker, a rear left speaker, and a rear right speaker, damping characteristic can be deteriorated, but this characteristic can be improved in certain example embodiments of the present invention.

In other words, example embodiments of the present disclosure may transmit a low output audio signal in a small signal type, not conventional high output audio output signal, and amplification may be conducted just before reproduction of an audio by an outside speaker and thus, the problem of declination of damping can be improved.

In addition, power is supplied substantially evenly from an audio of a vehicle and thus, if the power is used, an audio signal in a small signal type can be transmitted. That is, with a thin signal line, audio system of a vehicle can be constructed.

Figure 8:
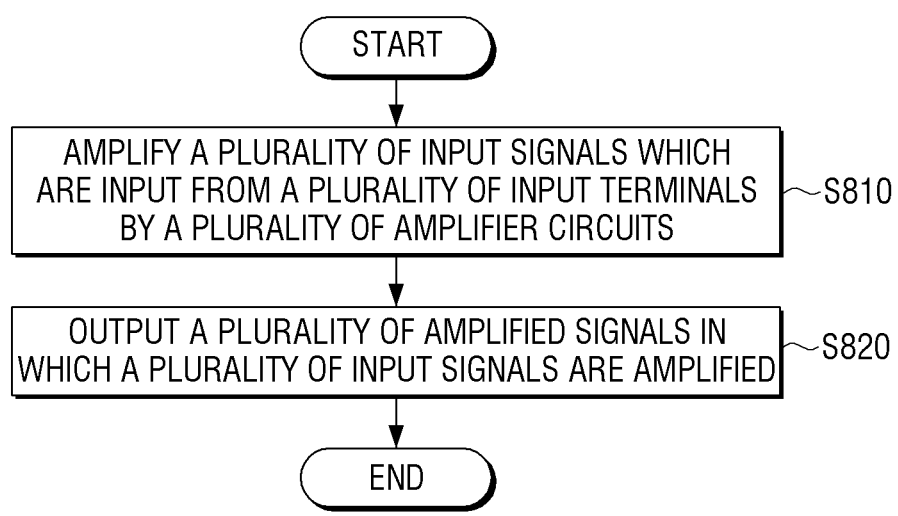
FIG. 8 is a flowchart to describe a control method of an amplifier module according to a exemplary embodiment.

FIG. 8 is a flowchart to describe a controlling method of an amplifier module 100 according to an exemplary embodiment.

A controlling method of an amplifier module 100 which includes a plurality of input terminals, a plurality amplifier circuits, and at least one speaker which is directly connected to at least one output terminal from among the plurality amplifier circuits amplifies a plurality of input signals which are input from each of a plurality of input terminals by a plurality of amplifier circuits (S810). In addition, by the plurality of amplifier circuits, a plurality of amplified signals in which a plurality of input signals are amplified are output (S820). Here, in the step of outputting (S820), a plurality of amplified signals can be output to at least one speaker based on the number of at least one speakers.

Here, in the outputting step S820, in the first operation mode in which the speaker is directly connected to the output terminal of one of the plurality of amplifier circuits, and there is no speaker directly connected to the other output terminal of the plurality of amplifier circuits, the plurality of amplified signals are coupled and provided to the directly-connected speaker, and in case of the second operation mode in which the plurality of speakers are directly connected to the output terminals of the plurality of amplifier circuits, each of the plurality of amplified signals can be provided to the plurality of speakers.

In operation S820, the switch connected to the output terminal of the plurality of amplifier circuits in the first operation mode is turned on and the space between the output terminals of the plurality of amplifier circuits are short-circuited by the switch. And in a second mode of operation the switches are turned off to open the output terminals of the plurality of amplifier circuits and each of the plurality of amplified signals can be provided to the plurality of speakers.

The plurality of amplifier circuits may be bridge-tied load (BTL) type amplifier circuits. In operation S820, the output terminals of the plurality of amplifier circuits are connected in parallel by a switch in the first operation mode and may amplify the current of the plurality of amplified signals.

Alternatively, the plurality of amplifier circuits may be a single ended (SE) type amplifier circuit, and the outputting step S820 may include serially connecting the outputs of the plurality of the amplifier circuits by a switch in a first operation mode and is a controlling method for amplifying the voltage of the plurality of amplified signals.

The plurality of input terminals include a power input terminal, a ground terminal, a first input signal terminal, and a second input signal terminal. The plurality of amplifier circuits include a first amplifier circuit and a second amplifier circuit. The step S810 may amplify a first input signal input from a first input signal terminal by a first amplifier circuit and amplify a second input signal input from a second input signal terminal by a second amplifier circuit.

In operation S820, if the first input signal and the second input signal are the same or opposite in phase, a plurality of amplified signals may be combined and provided to a directly-coupled speaker.

The plurality of amplifier circuits may further include a plurality of output terminals connected to each of the output terminals of the plurality of amplifier circuits, and at least one speaker may be directly connected to at least one of the plurality of output terminals to be connected to the plurality of amplifier circuits.

In addition, each of the plurality of amplifier circuits may include at least one amplifier IC and a capacitor.

Figure 9:
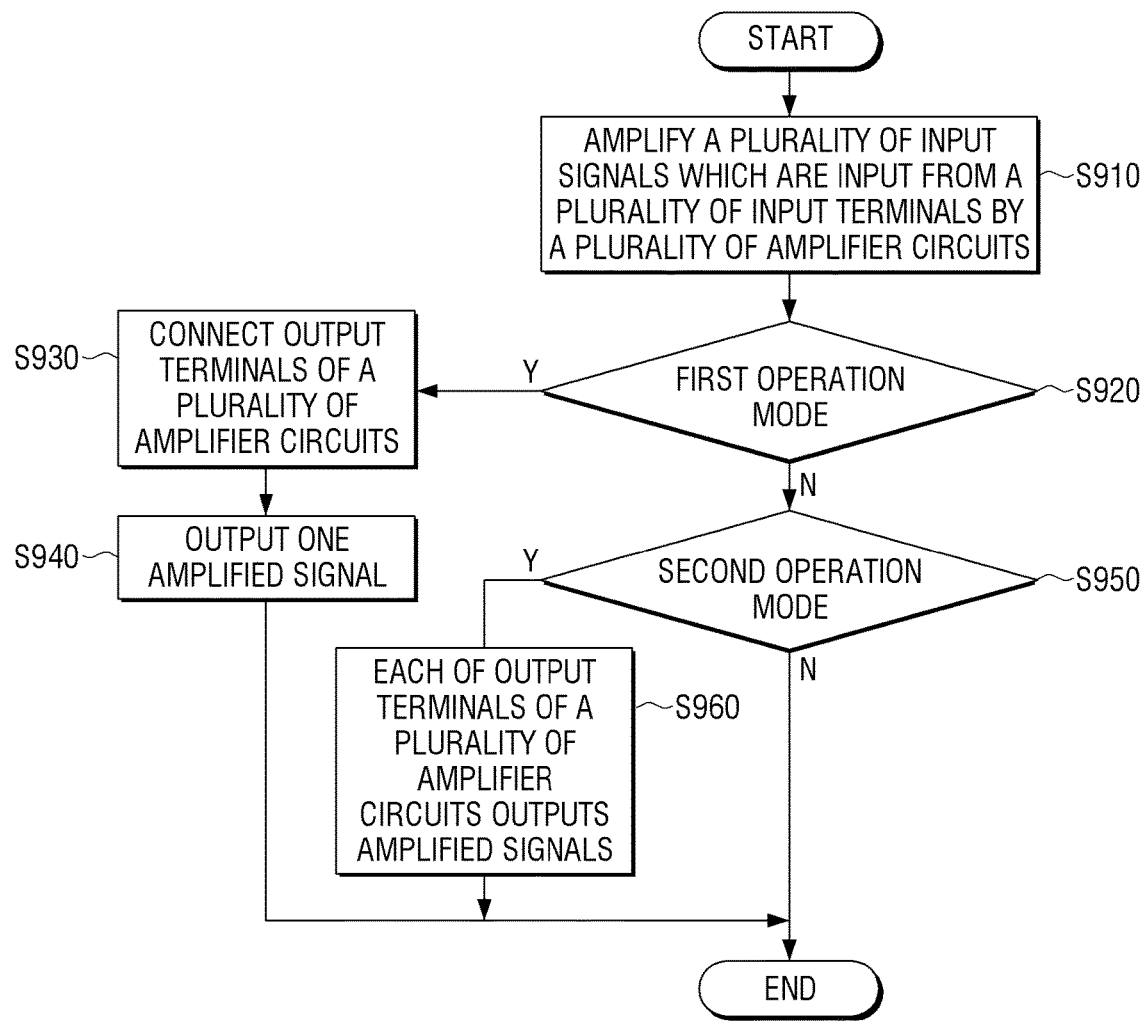
FIG. 9 is a flowchart to describe an operation of an amplifier module according to an operation module of an exemplary embodiment.

FIG. 9 is a flowchart to describe an operation of an amplifier module according to an operation mode according to an exemplary embodiment.

First, the plurality of input signals inputted from the plurality of input terminals are amplified by a plurality of amplifier circuits in S910. Here, the plurality of input signals may be signals on/of different channels or may be the same signal. Also, the plurality of input signals may be signals having opposite phases.

When the input signal is amplified and in the first operation mode in S920-Y, the output terminal of the plurality of amplifier circuits may be connected in S930. Then, one amplified signal may be output by the connected output stage in S940.

If it is not the first operation mode in S920-N, but the second operation mode in S950-Y, each output terminal of the plurality of amplifier circuits can output an amplified signal in S960.

Here, the amplifier module may determine the operation mode based on one or more of the number of input signals input from the plurality of input terminals, whether the input signal is the same signal, the phase difference, and the number of connected speakers.

According to various embodiments of the present invention as described above, the amplifier module operates in various modes according to the number of direct speakers, and the output terminal of the amplifier module and the input terminal of the speaker are directly connected to provide improved audio performance.

Meanwhile, the methods according to various embodiments may be programmed and stored in various storage media. Accordingly, the methods according to various embodiments described above can be implemented in various types of electronic devices that execute the storage medium.

The display method according to the aforementioned exemplary embodiment may be implemented as a program and provided to a display apparatus. A program including the display method can be stored in a non-transitory recording medium and provided.

The non-transitory computer-recordable medium is not a medium configured to temporarily store data such as a register, a cache, or a memory but an apparatus-readable medium configured to semi-permanently store data. Specifically, the above-described various applications or programs may be stored in the non-transitory apparatus-readable medium such as a compact disc (CD), a digital versatile disc (DVD), a hard disc, a Blu-ray disc, a universal serial bus (USB), a memory card, or a read only memory (ROM), and provided therein.

The foregoing exemplary embodiments and advantages are merely exemplary and are not to be construed as limiting the inventive concept. The exemplary embodiments may be readily applied to other types of device or apparatus. Also, the description of the exemplary embodiments is intended to be illustrative, and not to limit the scope of the inventive concept, and many alternatives, modifications, and variations will be apparent to those skilled in the art.

What is claimed is:

1. An amplifier module comprising;
    a plurality of input terminals;
    a plurality of amplifier circuits configured to amplify a plurality of input signals which are input from the plurality of input terminals, respectively, and output a plurality of amplified signals; and
    at least one speaker directly connected to at least one output terminal from among the plurality of amplifier circuits,
    wherein the amplifier module is configured to selectively couple and decouple outputs of the plurality of amplifier circuits to and from each other based on both analysis of the input signals and the number of the at least one speaker directly connected to the output terminals.

2. The amplifier module of claim 1, wherein the amplifier module is configured to:
    in case of a first operation mode in which a speaker is directly connected to one output terminal from among the plurality of amplifier circuits and no speaker is directly connected to remaining output terminals from among the plurality of amplifier circuits, combine the plurality of amplified signals and provides the combined signal to the directly-connected speaker, and
    in case of a second operation mode in which a plurality of speakers are directly connected to each output terminal of the plurality of amplifier circuits, provide each of the plurality of amplified signals to the plurality of speakers.

3. The amplifier module of claim 2, further comprising:
a switch configured to be connected to an output terminal of the plurality of amplifier circuits,
wherein the amplifier module is configured to:
in the first operation mode, turn on the switch to short-circuit the output terminals of the plurality of amplifier circuits by the switch and combine the plurality of amplified signals, and
in the second operation mode, turn off the switch to open the output terminals of the plurality of amplifier circuits and provide each of the plurality of amplified signals to the plurality of speakers.

4. The amplifier module of claim 3, wherein the plurality of amplifier circuits are amplifier circuits of a bridge-tied load (BTL) type,
wherein the amplifier module is configured to connect in parallel the output terminals of the plurality of amplifier circuits by the switch in the first operation mode, and amplify current of the plurality of amplified signals.

5. The amplifier module of claim 3, wherein the plurality of amplifier circuits are amplifier circuits of a single ended (SE) type,
wherein the amplifier module is configured to serially connect the output terminals of the plurality of amplifier circuits by the switch in the first operation mode and amplify voltage of the plurality of amplified signals.

6. The amplifier module of claim 2, wherein the plurality of input terminals comprise a power input terminal, a grounding terminal, a first input signal terminal, and a second input signal terminal, and
wherein the plurality of amplifier circuits comprise:
a first amplifier circuit configured to receive a first input signal input from the first input signal terminal; and
a second amplifier circuit configured to receive a second input signal input from the second input signal terminal.

7. The amplifier module of claim 6, wherein the amplifier module, when the first input signal and the second input signal are the same or have opposite phases, is configured to combine the plurality of amplified signals and provide to the directly-connected speaker.

8. The amplifier module of claim 1, wherein the plurality of amplifier circuits further comprise:
a plurality of output terminals which are connected to each of the output terminals of the plurality of amplifier circuits,
wherein the at least one speaker is directly connected to at least one of the plurality of output terminals and connected to the plurality of amplifier circuits.

9. The amplifier module of claim 1, wherein each of the plurality of amplifier circuits comprises at least one amp integrated circuit (IC) and a capacitor.

10. A control method of an amplifier module which includes a plurality of input terminals, a plurality of amplifier circuits, and at least one speaker directly connected to at least one output terminal from among the plurality of amplifier circuits, the method comprising:
by the plurality of amplifier circuits, amplifying a plurality of input signals which are input from the plurality of input terminals respectively; and
outputting a plurality of amplified signals in which the plurality of input signals are amplified by the plurality of amplifier circuits,
wherein the outputting comprises selectively coupling and decoupling outputs of the plurality of amplifier circuits to and from each other based on both analysis of the input signals and the number of the at least one speaker directly connected to the output terminals.

11. The method of claim 10, wherein the outputting comprises, in case of a first operation mode in which a speaker is directly connected to one output terminal from among the plurality of amplifier circuits and no speaker is directly connected to remaining output terminals from among the plurality of amplifier circuits, combining the plurality of amplified signals and providing the combined signal to the directly-connected speaker, and in case of a second operation mode in which a plurality of speakers are directly connected to each output terminal of the plurality of amplifier circuits, providing each of the plurality of amplified signals to the plurality of speakers.

12. The method of claim 11, wherein the outputting comprises, in the first operation mode, turning on the switch to short-circuit the output terminals of the plurality of amplifier circuits by the switch and combining the plurality of amplified signals, and in the second operation mode, turning off the switch to open the output terminals of the plurality of amplifier circuits and providing each of the plurality of amplified signals to the plurality of speakers.

13. The method of claim 12, wherein the plurality of amplifier circuits are amplifier circuits of a bridge-tied load (BTL) type,
wherein the outputting comprises connecting in parallel the output terminals of the plurality of amplifier circuits by the switch in the first operation mode, and amplifying current of the plurality of amplified signals.

14. The method of claim 12, wherein the plurality of amplifier circuits are amplifier circuits of a single ended (SE) type, wherein the outputting comprises serially connecting the output terminals of the plurality of amplifier circuits by the switch in the first operation mode and amplifying voltage of the plurality of amplified signals.

15. The method of claim 11, wherein the plurality of input terminals comprise a power input terminal, a grounding terminal, a first input signal terminal, and a second input signal terminal,
wherein the plurality of amplifier circuits comprise:
a first amplifier circuit and a second amplifier circuit,
wherein the amplifying comprises amplifying the first input signal input from the first input signal terminal by the first amplifier circuit, and amplifying the second input signal input from the second input signal terminal by the second amplifier circuit.

16. The method of claim 15, wherein the outputting comprises, when the first input signal and the second input signal are the same or have opposite phases, combining the plurality of amplified signals and providing to the directly-connected speaker.

17. The method of claim 10, wherein the plurality of amplifier circuits further comprise:
a plurality of output terminals which are connected to each of the output terminals of the plurality of amplifier circuits,
wherein the at least one speaker is directly connected to at least one of the plurality of output terminals and connected to the plurality of amplifier circuits.

18. The method of claim 10, wherein each of the plurality of amplifier circuits comprises at least one amp integrated circuit (IC) and a capacitor.

19. A recordable medium having a program to execute an operation method of an amplifier module which includes a plurality of input terminals, a plurality of amplifier circuits, and at least one speaker directly connected to at least one output terminal from among the plurality of amplifier circuits, wherein the operation method comprises:

amplifying a plurality of input signals input from each of the plurality of input terminals by the plurality of amplifier circuits; and outputting a plurality of amplified signals in which the plurality of input signals are amplified by the plurality of amplifier circuits, wherein the outputting comprises selectively coupling and decoupling outputs of the plurality of amplifier circuits to and from each other based on both analysis of the input signals and the number of the at least one speaker directly connected to the output terminals.

* * * * *